United States Patent [19]

Squitieri et al.

[11] 3,991,463
[45] Nov. 16, 1976

[54] METHOD OF FORMING AN INTERCONNECTOR

[75] Inventors: Vincent Squitieri, Billerica; William Joseph Lynn, Groveland, both of Mass.

[73] Assignee: Chomerics, Inc., Woburn, Mass.

[22] Filed: May 19, 1975

[21] Appl. No.: 578,935

[52] U.S. Cl. .................................... 29/629; 29/423; 29/630 R; 339/17 M; 339/59 M; 339/DIG. 3
[51] Int. Cl.² ........................................ H02G 15/00
[58] Field of Search ................. 29/628, 629, 630 R, 29/630 B, 418, 423, 424; 339/17 LM, 17 M, DIG. 3, 59 M, 59 R

[56] References Cited
UNITED STATES PATENTS

| | | | |
|---|---|---|---|
| 3,039,177 | 6/1962 | Burdett | 29/423 X |
| 3,345,741 | 10/1967 | Reimann | 29/423 X |
| 3,399,444 | 9/1968 | Jacoby | 29/423 X |
| 3,861,135 | 1/1975 | Seeger et al. | 58/50 R |
| 3,883,213 | 5/1975 | Glaister | 339/61 M |

*Primary Examiner*—James R. Duzan
*Attorney, Agent, or Firm*—Sewall P. Bronstein; Donald Brown

[57] ABSTRACT

An electrical interconnector for coupling circuit board terminals or the like to a liquid crystal package terminal, circuit board terminals, integrated circuit terminals, etc., and which includes an insulator support e.g., having at least two surfaces to which electrically conductive plastic strips are attached. There is also disclosed a new and improved method particularly suitable for attaching said strips to said surfaces around a corner as well as for attaching said strips to other shaped bodies.

3 Claims, 17 Drawing Figures

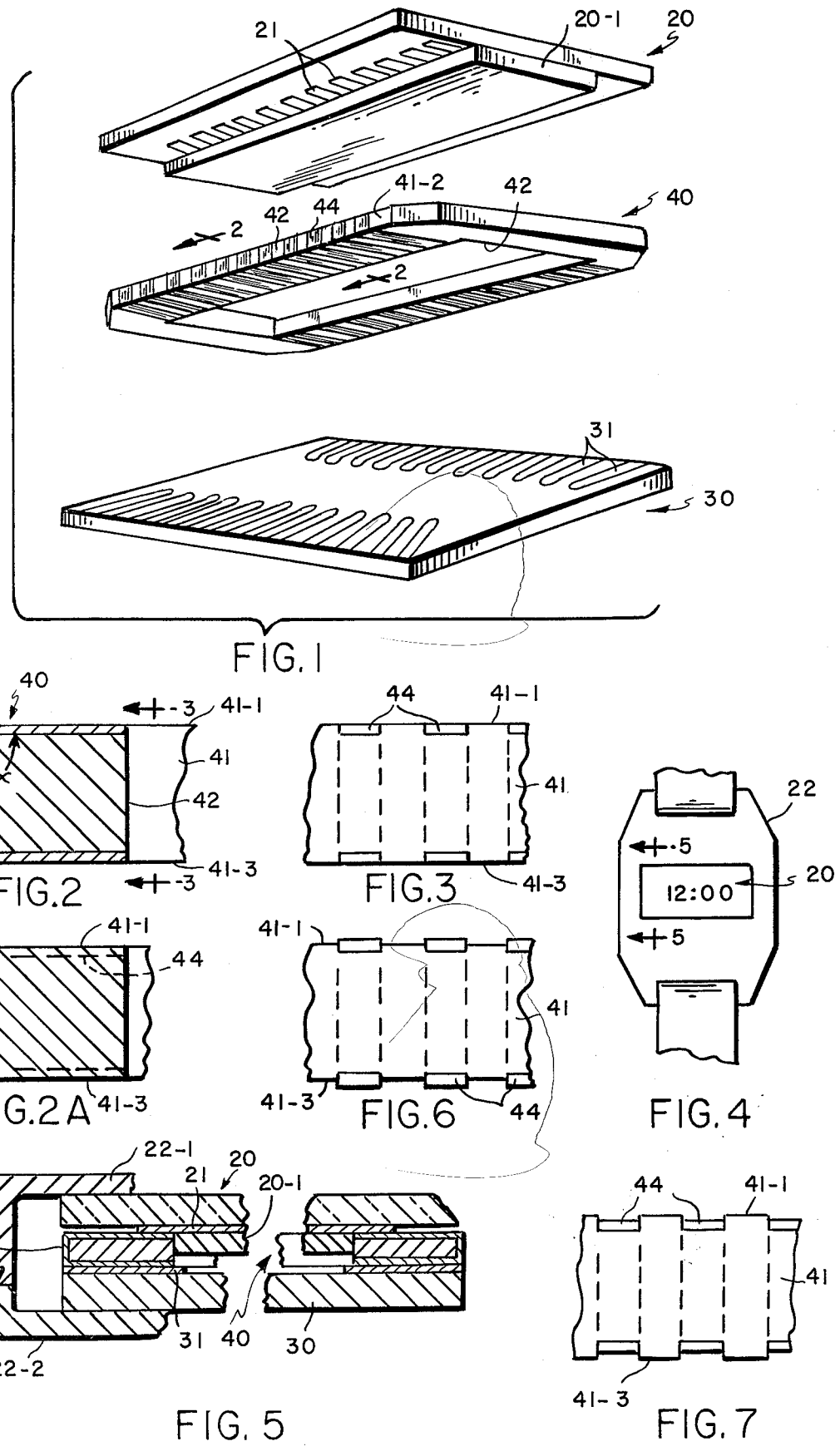

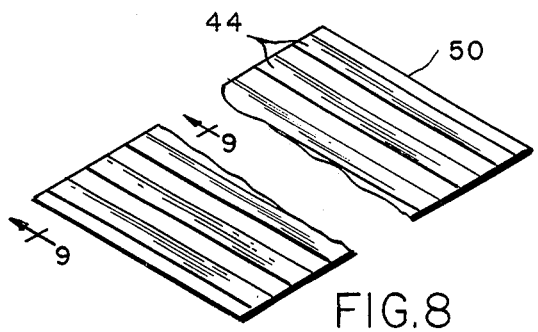
FIG.8
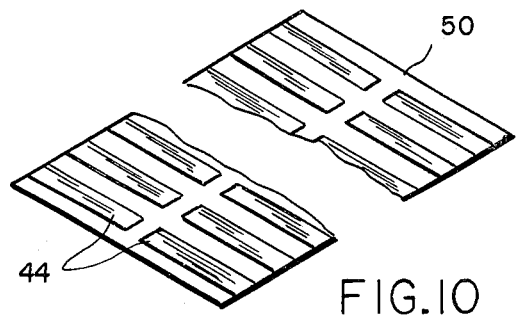
FIG.10
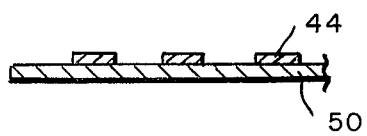
FIG.9
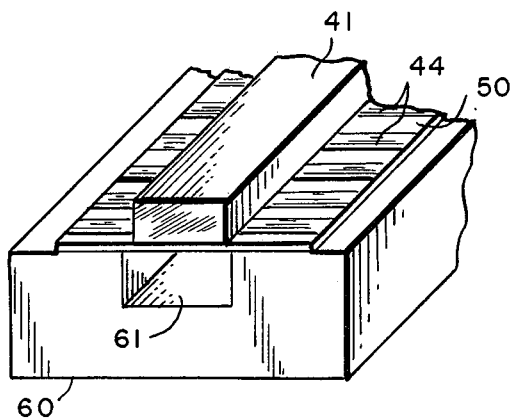
FIG.11
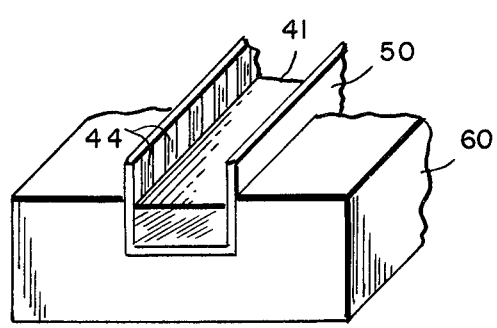
FIG.12
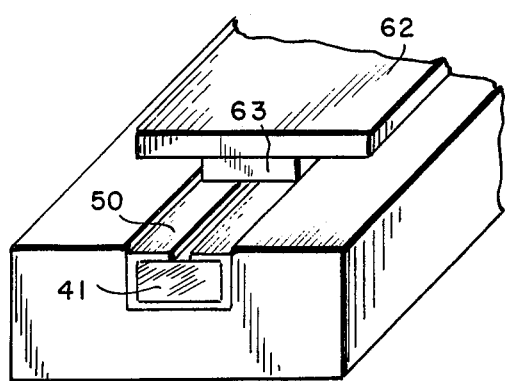
FIG.13
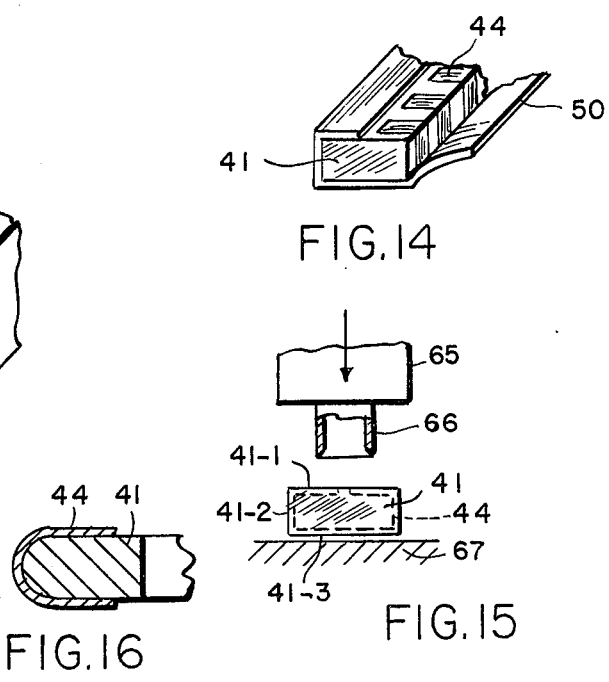
FIG.14
FIG.16
FIG.15

METHOD OF FORMING AN INTERCONNECTOR

BACKGROUND OF THE DISCLOSURE

This invention is directed to a new and improved electrical interconnector system and method of making same in order to couple terminals at the edge of a liquid crystal package, integrated circuit array circuit board or the like to a circuit board, integrated circuit array or the like.

Liquid crystal packages have begun to gain prominence in many applications as for example, as a display for digital watches. See the magazine THE ELECTRONIC ENGINEER, November, 1972, pages 70–72 published by the Chilton Company, Philadelphia, Pa.

Such liquid crystal packages have in the past been generally coupled to the circuit board containing elements for controlling the liquid crystals via wires soldered between the circuit board and the terminal of the liquid crystal package.

Although this method is quite adequate it does suffer disadvantages in that soldering is expensive and replacement of the circuit board or the liquid crystal package is most difficult in that the wires must be unsoldered. In addition, failure may occur due to shock or vibration causing an electrical disconnect.

Other types of interconnectors using conductive plastic have been reported in the art (for example, see U.S. Pat. Nos. 3,818,279 and 3,861,136) but they suffer disadvantages in that they are difficult to inexpensively manufacture in volume quantities while still maintaining the necessary reliability needed in many applications.

In addition, the fold-over scheme shown in FIG. 9 of U.S. Pat. No. 3,818,279 has not always proved reliable since folding the conductive plastic strips on a single surface as shown causes portions being bent over to stretch and thus causes separation in the conductive particles carried in the strips. Separation of the particles causes a substantial increase in resistance of the strip and thus is in some cases no longer usable for its intended purposes.

Reference may also be had to U.S. Pat. Nos. 3,680,037, 3,620,873, 3,670,205 and 3,434,401 for a better understanding of the art of interconnectors.

In view of the foregoing a new and improved method was needed for constructing interconnectors overcoming the disadvantages of the prior art. In addition, a new and improved reliable interconnector was needed which has thin conductive connecting plastic strips positioned and supported around corners of an insulator support.

Thus the present invention in one aspect provides an interconnector in which conductive plastic strips are bonded about corners of an underlying insulator support. Thus, rectangular, triangular and other cross-sectional shaped interconnectors can now be reliably produced.

In another aspect this invention provides a new and improved method for transferring conductive plastic strips to an insulator support to form the improved interconnector.

The improved method now permits reliable bonding of conductive plastic segments around corners between or joining two surfaces e.g., two surfaces which if carried forward intersect at an angle $\alpha$ between about 30° to 135° and more preferably 60° to 120° (see FIG. 2). FIG. 2 particularly discloses an angle $\alpha$ of about 90°.

In a further aspect this invention provides a new and improved interconnector having inlaid conductive strips which extend to top, side and bottom surfaces (see FIG. 2) and which are at least partly exposed to permit electrical contact therewith.

In yet another aspect of this invention there are provided preformed conductive plastic strips which are bonded to and about surfaces of an insulator support as well as a new and improved method for bonding said strips to said support.

It should be understood that as used herein the term corner is meant to include a corner which may be rounded off.

SUMMARY OF THE DISCLOSURE

The present invention is directed to a new and improved method for the construction of the improved interconnector of the invention. The preferred method includes the steps of providing a flexible transfer support preferably in sheet form supporting one or more preformed conductive plastic strips which may be screened or coated thereon in a conventional manner.

The strips may be cured or partially cured. Thereafter an insulator body (solid) preferably plastic and preferably uncured is placed against a portion of said strips and then the transfer support and strips are folded so that further portions of said strip engages said body and portions of the strip at the strip at the fold are placed in compression.

Thereafter the strips are transferred from the transfer sheet to the body preferably by curing the body while applying pressure to urge the strip against the body.

The present invention also provides an interconnector in which conductive plastic strips are bonded to a plurality of insulator body surfaces and most preferably inlaid in the surfaces of the body or support.

In the preferred form of the invention the interconnector body is provided with a corner and the strips are bonded to and extend about the corner, the strip portion positioned about the corner being held by said body under compression so that the electrically conductive particles dispersed in the plastic binder of the conductive plastic strips are forced together.

As used herein the term plastic is meant to include thermoplastics, thermosetting plastics, elastomers such as synthetic and natural rubber.

It should also be understood that the support or body may also be glass, ceramic or other insulator materials but that a plastic support is preferred.

BRIEF DESCRIPTION OF THE DRAWINGS

FIG. 1 is a perspective view of the interconnector of the invention, a liquid crystal display, and a circuit board;

FIG. 2 is a sectional view taken along line 2—2 in FIG. 1;

FIG. 2A is a sectional view similar to FIG. 2 but taken between conductive strips to show the conductive plastic strip inlaid in the insulator support;

FIG. 3 is a view taken along line 3—3 in FIG. 2;

FIG. 4 illustrates a watch casing in which the interconnector, board and display are mounted;

FIG. 5 is a sectional view taken along line 5—5 in FIG. 4;

FIG. 6 shows in a view similar to FIG. 3 a modified form of the interconnector illustrating the inlaid conductive plastic strips extending substantially above the surface of the insulator support;

FIG. 7 shows in a view similar to FIG. 3 a modified form of the inlaid conductive plastic strips depressed into the insulator support;

FIGS. 8 and 9 illustrate a transfer sheet used in the method of the invention supporting conductive plastic strips;

FIG. 10 illustrates a modifed form of a transfer sheet having a different pattern of conductive plastic strips;

FIGS. 11–15 illustrate the preferred steps used in the method of making the interconnector of the invention;

FIG. 16 illustrates that the method can also be applied to form a device where the conductive strip is attached to the outer surface of an insulator support.

DESCRIPTION OF THE PREFERRED EMBODIMENT OF THIS INVENTION

Reference should now be had to FIGS. 1–5 for a description of the preferred form of the interconnector of this invention. At 20 there is shown a liquid crystal package which may be mounted in a watch casing 50 to display characters (FIG. 4) as shown. See the aforementioned pages 70–72 in the magazine THE ELECTRONIC ENGINEER for further details.

The underside of the package 20 includes electrical contacts 21 for the various character electrodes (not shown) in the liquid crystal package. In order to drive the various character electrodes through the contacts 21, there is provided a conventional circuit board 30 which will ordinarily include transistors, capacitors, resistors, etc., mounted thereon and coupled together in various circuit configurations.

At 31 there are shown output electrical contacts which would be coupled to the circuit positioned on the circuit board 30 and which provide electrical signals to drive the character electrodes through the contacts 21.

In order to connect the contacts 21 and 31 together, there is provided the interconnector 40 of this invention. The interconnector 40 comprises a non-conductive or insulator base or support 41 having an opening or cutout 42 therein. The cutout 42 extends between the top and bottom surfaces of the base. The term cutout means the space 42 no matter how formed.

The base or carrier 41 may be soft or hard and is substantially electrically non-conductive or insulating, such as a rubber, thermoplastic or thermosetting organic polymer compositions such as phenolics, melanimes, ureas, alkyds, polyamides, polycarbonates, polyethylene, silicone rubber, polypropylene, polyester, as for example trademarked products, e.g., Ebonite, Bakelite, Formica, Nylon and Lexan.

The base may also contain non-electrically conductive reinforcing fibers and/or fillers as well as coloring pigments. Materials such as glass, silica and other mineral fillers can be added.

The base 41 has top, side and bottom surfaces 41-1, 41-2 and 41-3 which intersect at an edge, line or corner 41-4 and 41-5.

The bottom and top surfaces are preferably substantially flat and parallel to each other whereas the side surface 42 may be flat, curved or curvilinear.

At 44 there are shown a plurality of electrically conductive plastic strips 44 comprising a binder and electrically conductive particles e.g., silicone rubber and silver particles. Each of the strips are spaced apart and isolated from each other and are positioned as shown in FIG. 5 to make contact between one contact 21 and one contact 31 in alignment therewith.

As shown in FIG. 3 the conductive strips are preferably inlaid and substantially flush with the top, side and bottom surfaces 41-1, 41-2 and 41-3 respectively so that they are securely held in place and will not separate. The strips 44 are preferably bonded to the base 41 so that they cannot be easily separated therefrom.

The conductive plastic strips may be any of the conventional flexible plastic binders such as polyethylene, polyester, polypropylene, and is more preferably of an elastomeric material such as silicone rubber, butadiene/nitrile rubber, etc., having a dispersion of electrically conductive particles to provide the conductivity. The particles may be of a noble metal such as silver, gold or other metals e.g., copper or a composite i.e., silver coated copper. In addition, other metal outer coated particles may be used such as metal coated glass, etc. Reference may be had to U.S. Pat. No. 3,861,135 for a further description of the particles.

In addition the metal content may vary considerably although 20 to 80 volume percent of particles will be quite adequate depending on the flexible plastic binder as will be apparent to those skilled in the art. A flexible plastic binder is preferably used in order to insure good comformance to the electrical contacts 21 and 31.

As may be observed the strips 44 which extend about the corners 41-4 and 41-5 are retained firmly in place. In the preferred construction the strip portions 44-1 positioned about the corners 44-4 and 44-5 is held under compression by the insulator support 41.

In FIGS. 4 and 5 there is shown a watch casing 22 comprising snappable sections 21-1 and 22-2. The sections when urged together as shown urge the display contacts 21 and board contacts 31 against the strip 44 in the top and bottom surfaces. In this manner electricity may flow between the display and the board contacts through the strips 44 when selectively aligned therewith.

In FIG. 2 the angle $\alpha$ is about 90°. It should be understood that the angle $\alpha$ between surfaces may vary thus e.g., may be between 30° to 135° and thus the insulator support and strip configurations will also vary so that triangular or other odd shaped corner interconnector configuration structures may be provided.

In FIG. 5 the member 20-1 of the display is positioned in the cutout 42 of the insulator support or frame to locate same.

FIG. 6 illustrates a modification of the interconnector of FIGS. 1 to 5. In this Figure the flexible conductive plastic strips 44 are partically inlaid and extend above the surfaces of the insulator support 41.

FIG. 7 illustrates a further modification of the interconnector of FIGS. 1 to 5. In this Figure the flexible conductive plastic strips 44 are depressed below the surfaces of the support 41.

In practice it is preferred that the strip surfaces in the top and bottom surfaces 41-1 and 41-3 be supported substantially parallel to each other so that good electrical contact may be made between normally parallel disposed electrical devices.

Reference should now be had to FIGS. 8, 9 and 11–15 for a description of the preferred method for constructing the interconnector of this invention. The preferred method is as follows:

1. A transfer sheet 50 is coated in a conventional manner e.g., by casting the sheet 50 with flexible conductive plastic strips 44. The continuous strips are formed from a solution of silicone rubber (RTV-815 — General Electric) 16 parts by weight, Handy and Harmon silver powder No. 222, 84 parts by weight and toluene as desired as a solvent to form a slurry. Screening may also be used with a different composition.

Thereafter the strips 44 are preferably permitted to cure at 250° F for five minutes in an oven thus leaving the preformed conductive strips 44.

It should be understood that partially cured strips 44 may be used if desired.

The strips are preferably 0.5 to 30 mils wide and about 1 to 10 mils thick to save the cost of conductive particles. The transfer sheet 50 may be a polyester, Mylar being preferred, since a release coating need not be used to separate the strips 44 therefrom as shown in FIG. 14.

Long sections of a transfer sheet 50 with strips or lines 44 may be formed and thereafter smaller sections may be cut therefrom and be placed in a mold.

Alternatively, small mold size sections of the transfer sheet and lines 44 may be initally fabricated.

2. Thereafter as shown in FIGS. 11 and 12 the transfer sheet with the lines 44 on top thereof is placed in a mold cavity 61 with a precut piece of uncured rubber (the insulator support 41). The support 41 may be fabricated in the preferred embodiment from 100 parts by weight of General Electric Silicone Rubber SE 5211 which is mixed with 1 part of Verox (50% active ingredient) Vanderbilt Co. The mold cavity 61 is shown open at the end to illustrate the method but in practice the cavity 61 is closed at the sides thereof.

3. The transfer sheet 50 and the strips 44 are then folded or wrapped about the rubber support 41 as shown in FIG. 13 and the mold top 62 and insert 63 is inserted thereover and the mold is closed. The mold is then placed in a heated press for 10 minutes at 340° F and pressure of 10,000 Psi is applied to force the mold top member 63 against the material in the cavity 61 in a conventional manner.

The temperature causes curing of the rubber piece 41 and the pressure causes the strips 44 to become inlaid in the piece 41 and bonded thereto during curing.

It should be understood that those skilled in the art would realize that the pressure as well as the temperature may be varied depending on the materials used. For example, the pressure may conventionally vary between 5000 to 40,000 Psi and the temperature can vary in a wide range depending on the plastic and curing agent used. In addition, the foldable transfer sheet 50 may be a polyamide, polypropylene, e.g., teflon, etc., depending on the temperatures and pressures used. In addition, conventional release coatings may be used if necessary depending on the materials to effect separation of the transfer sheet from the strips 44.

Depressed strips 44 shown in FIG. 7 may be formed by providing a mold with raised ridges in the interior thereof to force the segments below the rubber 41 surfaces.

4. At the end of the curing cycle, the molded piece is taken out as shown in FIG. 14 and the transfer sheet 50 is peeled therefrom.

5. Thereafter the hole 42 if desired may be diecut by use of a punch 65 having a cutter 66 as the piece 41 and strips are held on a table 67. Thus the frame interconnector device 40 may be formed in a new and improved manner.

In FIG. 10 there is shown a different configuration of the conductive strips 44 positioned on a transfer sheet 50. In this configuration no dicutting is needed to separate the strips 44 when interconnecting for example two devices which do not have a locating member as does the display.

It should be apparent that interconnectors with a single row of strips may be provided using the method disclosed herein.

FIG. 16 illustrates another application for this method where conductive plastic strips 44 may be applied on the outer surfaces of an insulator support (not inlaid). While this configuration has its place as an interconnector inlaid strips 44 are preferred since they are better secured to the underlying support 41.

It should be understood from the drawings that the folding of the transfer sheet 50 causes the conductive strip portion over and adjacent the fold line to become compressed forcing the conductive particles in the binder of the conductive strip closer together. Thus when the folded strip portion under compression is bonded to the insulator support 41 it continues to remain under compression and is held in compression by the insulator support when it is cured.

We claim:
1. The method of forming an interconnector having a row of electrically conductive flexible plastic strips inlaid in the top, bottom, and two side surfaces and the corners between said surfaces of a rectangular cross-section solid electrical insulator body of elastomeric material, said strips being spaced apart from each other and electrically isolated from each other, the method comprising the steps of:
   a. forming a row of a plurality of uncured flexible electrically conductive plastic strips on one side of a single foldable transfer sheet and at least partially curing said strips;
   b. placing the transfer sheet at least partially in a mold cavity having two sides and a bottom with the side of the transfer sheet opposite to the side supporting the strips in engagement with the sides and bottom of the mold cavity;
   c. placing a rectangular cross-section insulator body of at least partially cured elastomeric material on said transfer sheet while said transfer sheet is in said mold cavity so that each of said strips engages said bottom and side surfaces of said body;
   d. folding said sheet over the top of said body to bring each of said strips into engagement with said top of said body;
   e. holding said strips in contact with said sheet while applying heat and pressure to cure said body and inlay said strips in said body top, bottom and side surfaces and the corners between said surfaces; and
   f. removing said transfer sheet from said strips to leave said strips inlaid in said body.

2. The method of forming an interconnector having first and second oppositely disposed rows of electrically conductive flexible plastic strips, each strip inlaid in the top, bottom and a side surface and the corners between said surfaces of a rectangular cross-section solid electrical insulator body of elastomeric material, said strips being spaced apart from each other and electrically isolated from each other, the method comprising the steps of:
   a. forming a single row of a plurality of uncured flexible electrically conductive plastic strips on one side of a single foldable transfer sheet and at least partially curing said strips;
   b. placing the transfer sheet at least partially in a mold cavity having two sides and a bottom with the side of the transfer sheet opposite to the side supporting the strips in engagement with the sides and bottom of the mold cavity;

c. placing a rectangular cross-section insulator body of elastomer material of at least partially cured elastomeric material on said transfer sheet while said transfer sheet is in said mold so that each of said strips engages said bottom and side surfaces of said body;

d. folding said sheet over the top of said body to bring each of said strips into engagement with said top of said body;

e. holding said strips in contact with said sheet while applying heat and pressure to cure said body and inlay said strips in said body top, bottom and side surfaces and the corners between said surfaces;

f. removing said transfer sheet from said strips to leave said strips inlaid in said body and the corners therebetween; and g. forming a hole in said body between the top and bottom surfaces thereof to form said first and second rows of oppositely disposed strips.

3. The method of forming an interconnector having first and second oppositely disposed rows of a plurality of electrically conductive flexible plastic strips, each strip inlaid in the top, bottom and a side surface and the corners therebetween of a rectangular cross-section solid electrical insulator block of elastomeric material, said strips being spaced apart from each other and electrically isolated from each other, the method comprising the steps of:

a. forming two rows of a plurality of uncured flexible electrically conductive plastic strips on one side of a single foldable transfer sheet and at least partially curing said strips;

b. placing the transfer sheet at least partially in a mold cavity having two sides and a bottom with the side of the transfer sheet opposite to the side supporting the strips in engagement with the sides and bottom of the mold cavity;

c. placing a rectangular cross-section insulator body of elastomer material of at least partially cured elastomeric material on said transfer while said transfer sheet is in said mold so that each row of said strips engages said bottom surface and a different row of said strips engages a different side surface of said body;

d. folding said sheet over the top of said body to bring each of said rows of strips into engagement with said top of said body;

e. holding said strips in contact with said sheet while applying heat and pressure to cure said body and inlay said strips in said body top, bottom and side surfaces and the corners therebetween; and f. removing said transfer sheet from said strips to leave said strips inlaid in said body.

* * * * *